United States Patent
Yu et al.

(10) Patent No.: US 9,714,166 B2
(45) Date of Patent: Jul. 25, 2017

(54) THIN FILM STRUCTURE FOR HERMETIC SEALING

(71) Applicant: Taiwan Semiconductor Manufacturing Co., Ltd., Hsin-Chu (TW)

(72) Inventors: Shao-Chi Yu, Hsinchu (TW); Hsiang-Fu Chen, Zhubei (TW); Hsin-Ting Huang, Bade (TW); Chia-Ming Hung, Taipei (TW); Wen-Chuan Tai, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 62 days.

(21) Appl. No.: 14/332,461

(22) Filed: Jul. 16, 2014

(65) Prior Publication Data
US 2016/0016789 A1    Jan. 21, 2016

(51) Int. Cl.
*B81B 7/00* (2006.01)
*B81C 1/00* (2006.01)

(52) U.S. Cl.
CPC .... *B81C 1/00293* (2013.01); *B81B 2207/092* (2013.01); *B81B 2207/095* (2013.01); *B81B 2207/096* (2013.01); *B81C 2203/0109* (2013.01); *B81C 2203/0136* (2013.01)

(58) Field of Classification Search
CPC .............. B81C 2203/0109; B81C 2203/0136
See application file for complete search history.

(56) References Cited

U.S. PATENT DOCUMENTS

| | | | |
|---|---|---|---|
| 6,405,592 B1 * | 6/2002 | Murari | G01F 23/263 73/304 C |
| 7,259,041 B2 | 8/2007 | Stelzl et al. | |
| 7,923,790 B1 | 4/2011 | Quevy et al. | |
| 8,766,380 B2 | 7/2014 | in 't Zandt et al. | |
| 2007/0004080 A1 * | 1/2007 | Ouyang | B81B 7/007 438/106 |
| 2008/0164542 A1 | 7/2008 | Yang et al. | |
| 2010/0164083 A1 | 7/2010 | Yim | |
| 2011/0298064 A1 | 12/2011 | Pahl et al. | |
| 2012/0299131 A1 | 11/2012 | Henn | |
| 2013/0043510 A1 | 2/2013 | Shu et al. | |

FOREIGN PATENT DOCUMENTS

| | | |
|---|---|---|
| CN | 101142137 A | 3/2008 |
| CN | 101234745 A | 8/2008 |
| CN | 103121658 A | 5/2013 |
| CN | 103818868 A | 5/2014 |
| WO | 2009038686 A2 | 3/2009 |

* cited by examiner

*Primary Examiner* — Dung Le
(74) *Attorney, Agent, or Firm* — Eschweiler & Potashnik, LLC

(57) ABSTRACT

The present disclosure relates to a MEMS device with a hermetic sealing structure, and an associated method. In some embodiments, a first die and a second die are bonded at a bond interface region to form a chamber. A conformal thin film structure is disposed covering an outer sidewall of the bond interface region to provide hermetic sealing. In some embodiments, the conformal thin film structure is a continuous thin layer covering an outer surface of the second die and a top surface of the first die. In some other embodiments, the conformal thin film structure comprises several discrete thin film patches disposed longitudinal.

21 Claims, 10 Drawing Sheets

THIN FILM STRUCTURE FOR HERMETIC SEALING

BACKGROUND

Wafer level packaging (WLP) or wafer level chip scale packaging (WLCSP) is a packaging method where a semiconductor wafer is packaged and tested at the wafer level, and then later diced into individual chip size packages. This method decreases package size, reduces production cycle, and reduces cost compared to traditional methods where wafers are diced into individual chips which are separately tested and packaged.

WLP for some wafers require some special features, for example, hermetic sealing. Some MEMS devices, such as inertial sensors for example, need a cavity having a constant pressure, while other MEMS devices need a low pressure environment. Still other MEMS devices need a cavity that is large enough to allow for moving parts, which may need protection from environmental conditions such as humidity and dust.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
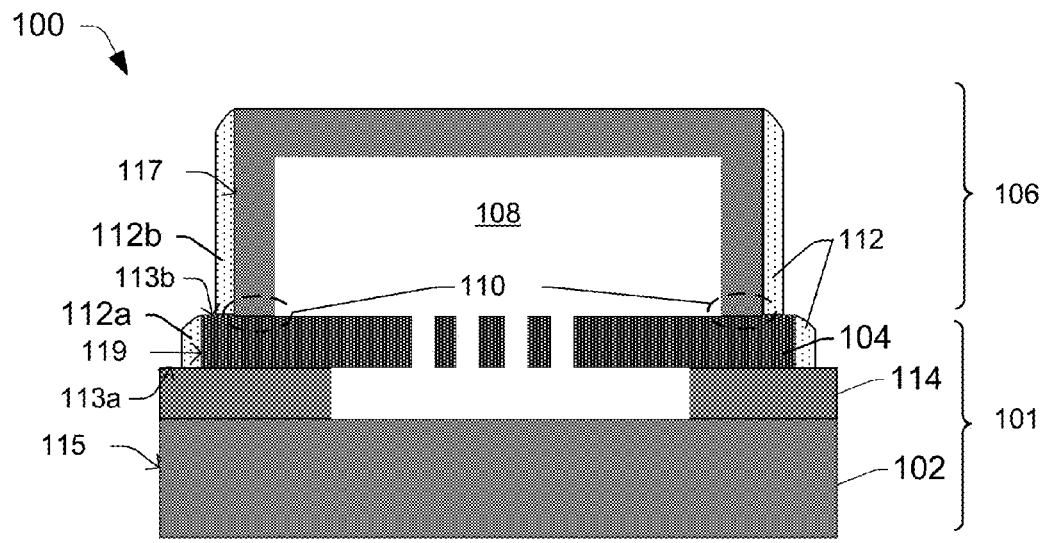
FIGS. 1a and 1c illustrate cross-sectional views of some embodiments of a MEMS device with a hermetic sealing structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Conventionally, a hermetic seal for wafer level packaging (WLP) process can be achieved by wafer to wafer bonding with a hermetic bonding interface. Unfortunately, it is very hard to achieve a higher hermetic level using conventional hermetic sealing techniques. Also, some constraints would be introduced in order to obtain the hermetic bonding interface that may limit manufacturing flexibility and sometimes may damage circuitry or even kill devices. For example, such constraints include high temperature treatment, long processing time, and requirement of flat surface.

In order to achieve a reliable hermetic sealing for WLP, the present disclosure sets forth hermetic sealing structures and manufacturing methods therefor. In some embodiments, structures formed by WLP techniques include a first die and a second die that are bonded at a bond interface region to form a chamber. A conformal thin film structure is disposed covering an outer sidewall of the bond interface region to provide hermetic sealing. In some embodiments, the conformal thin film structure is a continuous thin layer covering an outer surface of the second die and an exposed portion of a top surface of the first die including the bond interface region. In some other embodiments, the conformal thin film structure comprises several discrete thin film patches disposed in the longitudinal direction. In this case, a blanket reactive ion etching (RIE) process can be performed after forming a conformal thin film layer to form the discrete thin film patches. Notably, the chamber is not necessary to be hermetic before the outer sidewall of the bond interface region is covered by the conformal thin film structure. The chamber is hermetically sealed by the conformal thin film structure having a substantially constant pressure.

Devices having disclosed hermetic sealing structures can be formed by a method of WLP. First, a first wafer is bonded with a second wafer enclosing a plurality of chambers. Then, the second wafer is "singulated" or "opened" while the bonded second wafer still acts as integrity. This step is also known as "partial singulation". A portion of the second wafer is removed along scribe lines to form recesses through the second wafer that the second wafer is divided into individual components bonded to the first wafer separately at bond interface regions. Outer sidewalls of the bond interface regions and sidewalls of the individual components of the second wafer are exposed to the ambient environment after partial singulation together with a portion of a top surface of the first wafer which is aligned with the recesses. Then, a conformal thin film layer is formed along the exposed portions of the first and second wafer to seal the chambers hermetically. Then a dicing process is performed to the first wafer along the scribe lines to form singulated devices.

Figure 9A:
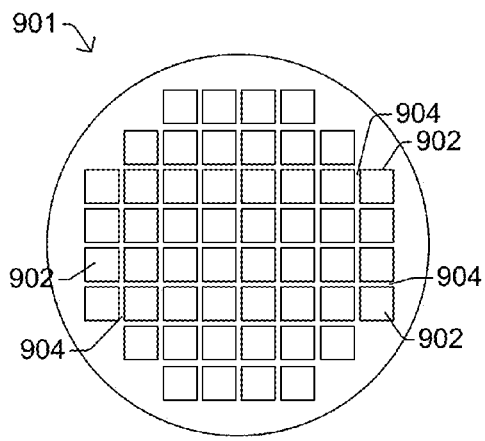
FIGS. 9a-9b illustrate top views of a semiconductor wafer.

FIG. 9a shows a first semiconductor wafer 901 that includes a number of dies 902 separated by scribe lines 904.

Figure 9B:
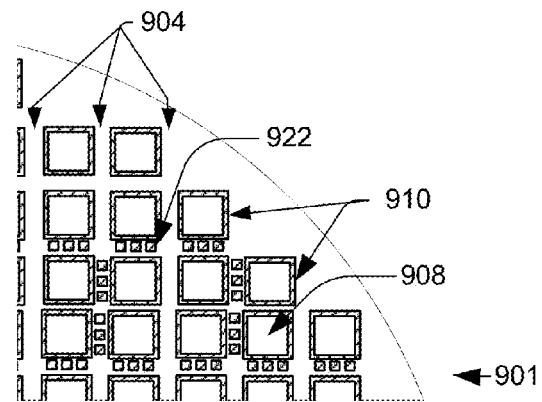
Figure 9C:
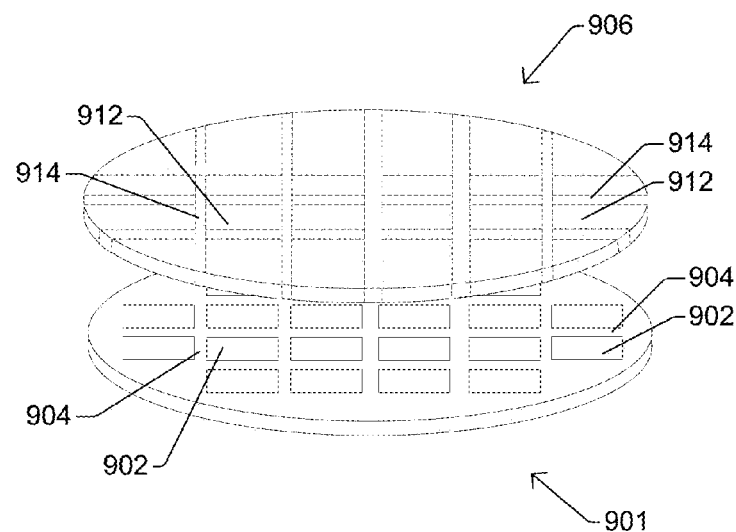
FIG. 9c illustrates a perspective-sectional view of a semiconductor wafer.

Each die can comprise semiconductor devices or MEMS devices disposed thereon. FIG. 9b shows some more structures of the first wafer 901. The first wafer 901 can comprise a bond region 910 to bond the first wafer 901 with another wafer and a wire-bond pad 922 to provide electrical connection. The bond region 910 can exhibit different shapes, dimensions and materials depend on bonding techniques used. For example, the bond region 910 can be rectangular metal rings as shown in FIG. 9b if eutectic metal bonding is utilized. The bond region can alternatively be several bonding pads distributed around each die and/or the bond region can comprise other materials such as glass, silicon or polymer. FIG. 9c shows a second wafer 906 to be bonded with the first wafer 901. In some embodiments, the second wafer 906 can have interconnection structures and/or semiconductor devices such as CMOS devices or MEMS devices. In some other embodiments, the second wafer 906 can be a capping wafer made of silicon or other materials configured to enclose a chamber 908 with the first wafer 901 wherein a MEMS device can reside at least partially within the chamber or is in fluid communication with the chamber. After a bonding process, the second wafer 906 is bonded ("stacked") on top of the first wafer 901. Bond interface regions are contact interface regions of the first and second wafers 901 and 906 having a same or smaller area than the bond region of the first wafer 901. For some bonding techniques, bonding rings or bonding pads are also disposed on to the second wafer 906 corresponding to the bonding region of the first wafer 901. For some other bonding techniques, for example, silicon direct bonding, the first and second wafers 901 and 906 are contacted at the bonding interface regions without solder, epoxy or other bonding material disposed on either wafer. Then a portion 914 of the second wafer 906 aligned with the scribe lines 904 of the first wafer 901 can be removed leaving separated components 912 bonded to the first wafer 901. The removal of the portion 914 exposes outer sidewalls of the components 912 and bonding regions 910 and a portion of a top surface of the first wafer 901 under the removed portion 914. A conformal thin film structure is then formed over the exposed regions to seal the chambers 908. After the chambers 908 have been sealed, the first wafer 901 is then cut along scribe lines 904 between neighboring dies 902, such that each die corresponds to a separate integrated circuit with multiple substrates.

By utilizing the conformal thin film structure to help sealing the chambers 908, requirements for conventional sealing manufacturing process are reduced. For example, the temperature and/or the process time of a heat treatment are not as strict as before. The contact regions of the two wafers do not need to be extremely flat in order to get hermetic sealing. Besides more flexibility for the manufacturing processes, a more reliable hermetic chamber with a higher hermetic level is also achievable.

Figure 1B:
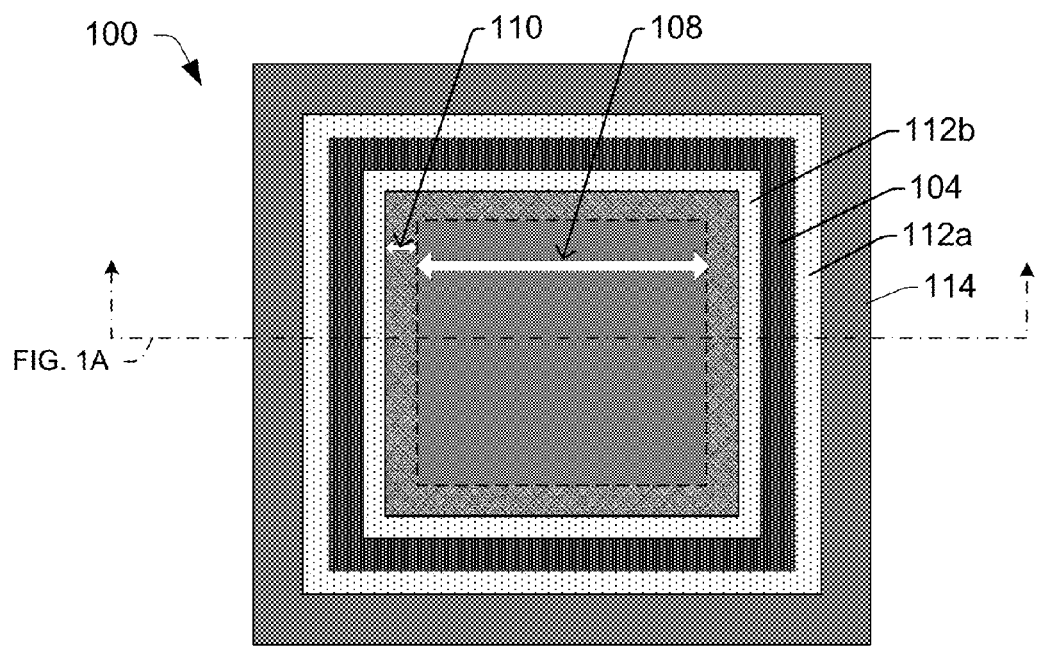
FIG. 1b illustrates a top view of some embodiments of a MEMS device with a hermetic sealing structure.

FIG. 1a shows a cross-sectional view of some embodiments of a MEMS device 100 with a hermetic sealing structure. FIG. 1b shows a top view of the MEMS device 100 corresponding to FIG. 1a. The MEMS device 100 comprises a first die 101 and a second die 106 bonded at a bond interface region 110. A chamber 108 is formed between the first die 101 and the second die 106. A MEMS device 104 is disposed on a substrate 102 of the first die 101 and resides at least partially within the chamber 108 or is in fluid communication with the chamber 108. A conformal thin film structure 112 is disposed along an outer sidewall 117 of the second die 106. The conformal thin film structure 112 covers the outer sidewall of the bond interface region 110 and seals the chamber 108 hermetically. In some embodiments, the conformal thin film structure 112 comprises a single layer or multiple stacked layers of silicon nitride ($Si_3N_4$) or silicon dioxide ($SiO_2$). The conformal thin film structure 112 can be formed by chemical vapor deposition (CVD) at a thickness that thick enough for the hermetical sealing. For example, the conformal thin film structure 112 can have a thickness in a range of from about 500 Å to about 10 μm. Notably, bonding structure of the first die 101 and the second die 106 is not particularly limited and known bonding structures applicable to the MEMS device and WLP techniques are also contemplated as falling within the scope of this disclosure. For example, glass frit bonding, eutectic metal bonding, silicon fusion boding, polymer bonding or direct bonding can be utilized to form the bond interface region 110. The chamber 108 of the MEMS device 100 may be filled with a gas that is not in communication with the ambient environment. The chamber 108 has a substantially constant pressure in some embodiments while the chamber's pressure varies based on the ambient environment in some other embodiments. For example, for a MEMS pressure sensor, the chamber 108 is deformable with an elastic medium and its pressure changes with a volume change. A dielectric layer 114 can be disposed over a substrate 102 being a part of the chamber 108. The substrate 102 of the first die 101 may comprise any type of semiconductor material including a bulk silicon wafer, a binary compound substrate (e.g., GaAs wafer), or higher order compound substrates, with or without additional insulating or conducting layers formed thereover, among others.

In FIG. 1a, as a non-limiting example for easy illustration, the conformal thin film structure 112 comprises a first portion 112a disposed onto a sidewall of the MEMS device 104 and a discrete second portion 112b disposed onto a sidewall 117 of the second die 106. Both portions 112a and 112b are disposed longitudinally and terminate on a lateral surface of the first die 101 (the first portion 112a terminates on a first portion 113a of the lateral surface and the second portion 112b terminates on a second portion 113b of the lateral surface). The conformal thin film structure 112 does not extend along a singulated sidewall 115 of the first die 101.

Figure 1C:
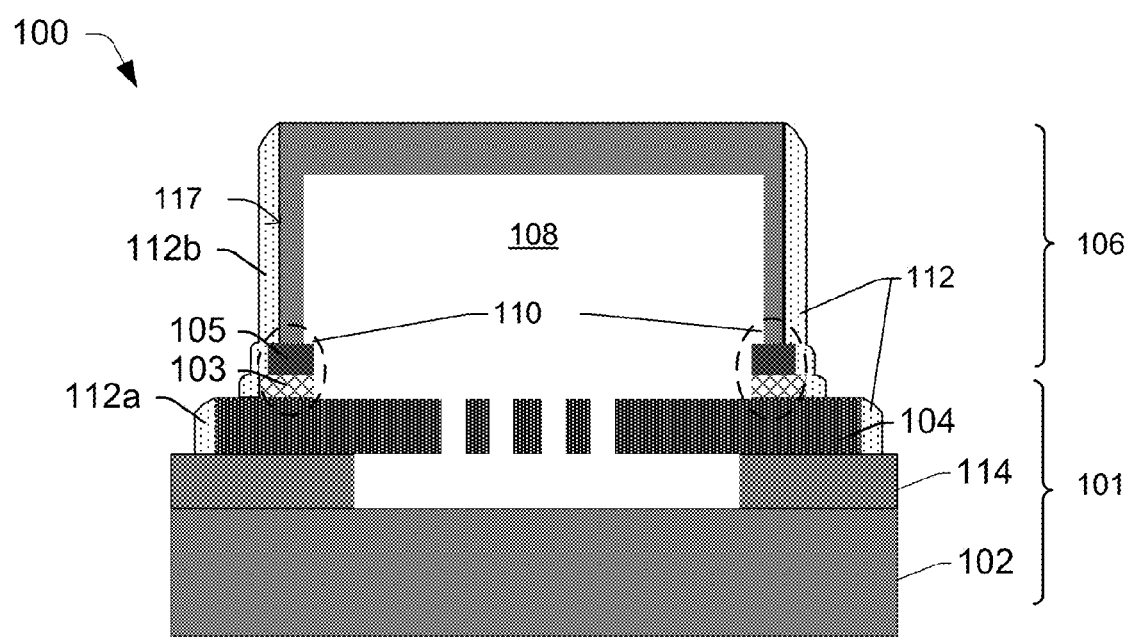

FIG. 1c shows an example of the MEMS device 100 wherein an eutectic metal bond is used to bond the first and second dies 101 and 106. In FIG. 1c, the bond interface region 110 comprises a first bonding pad 103 disposed onto the first die 101 and a second pad 105 disposed onto the second die 106. The first and second bonding pads 103 and 105 may comprise materials such as indium, gold, tin, copper, aluminum, germanium or combinations thereof.

Figure 2A:
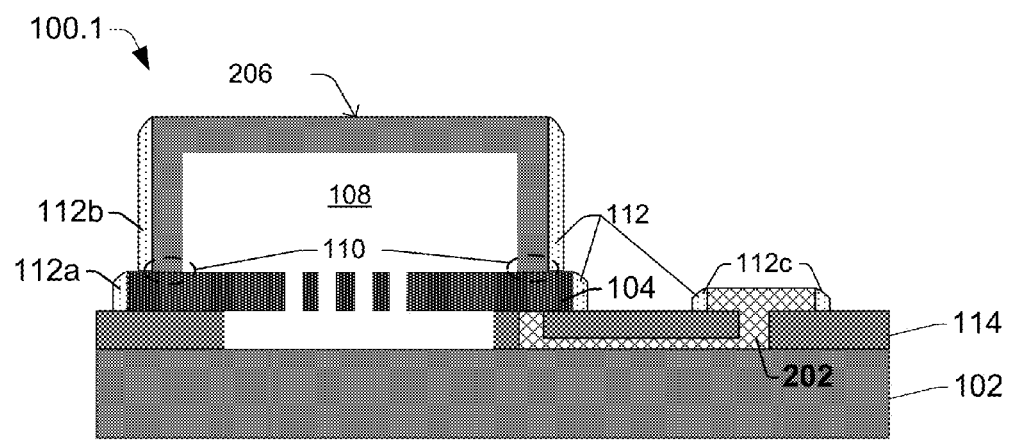
FIG. 2a illustrates a cross-sectional view of some embodiments of a MEMS device with a hermetic sealing structure.
Figure 2B:
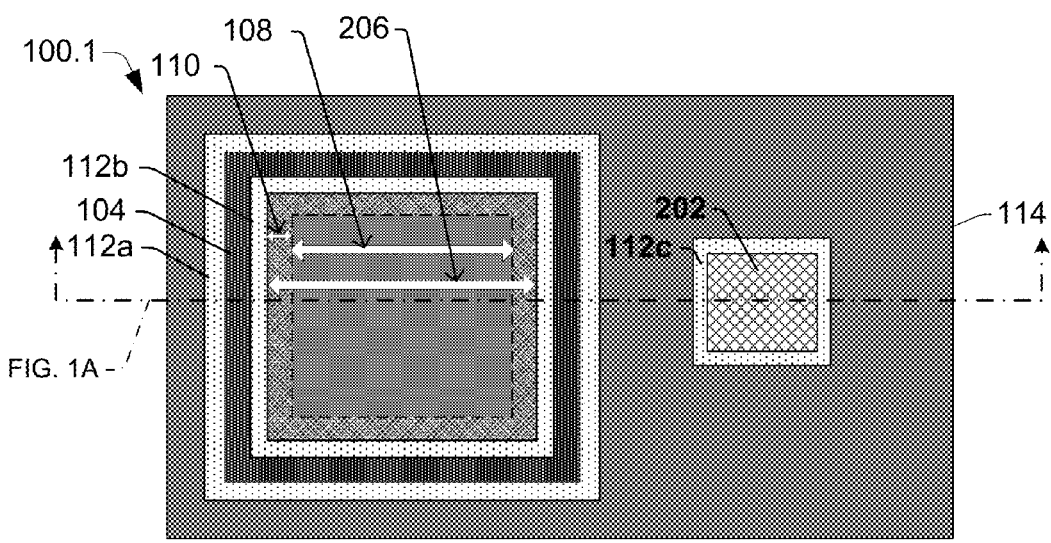
FIG. 2b illustrates a top view of some embodiments of a MEMS device with a hermetic sealing structure.

FIGS. 2a and 2b illustrate a cross-sectional view and a corresponding top view of some embodiments of a MEMS device 100.1 with a hermetic sealing structure 112. As a non-limiting example for easy illustration, the conformal thin film structure 112 comprises a first patch 112a disposed onto a sidewall of the MEMS device 104, a discrete second patch 112b disposed onto a sidewall of the second die 106 and a discrete third patch 112c disposed on a sidewall of a wire-bond pad 202. The top surface of the wire-bond pad 202 is not covered by the hermetic sealing structure 112 as other lateral surface of the MEMS device 100. The wire-bond pad 202 provides electrical connections for the MEMS device 100.

Figure 3:
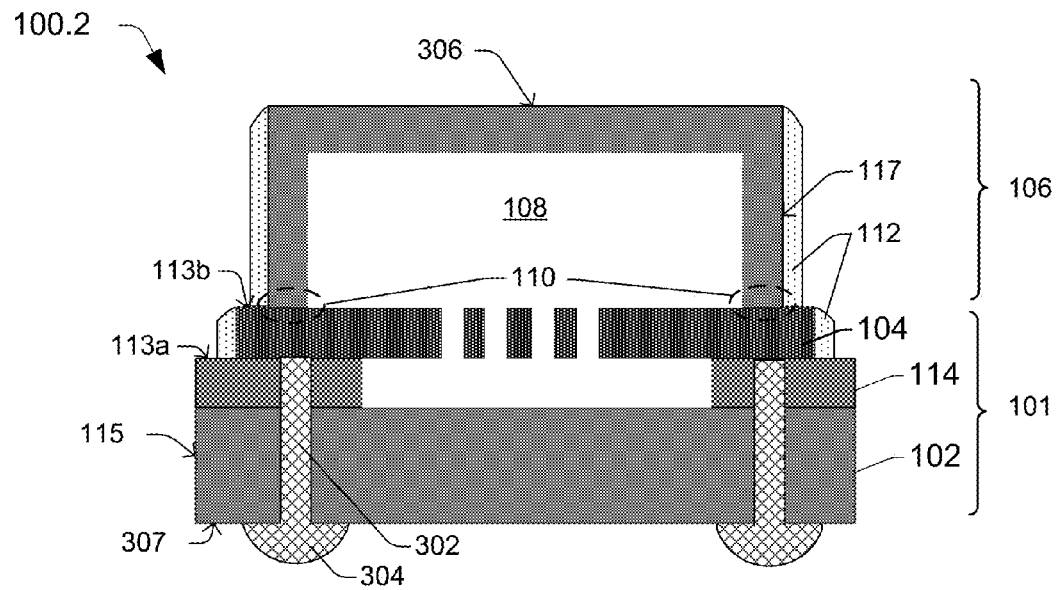
FIGS. 3-6 illustrate cross-sectional views of some other embodiments of a MEMS device with a hermetic sealing structure.
Figure 4:
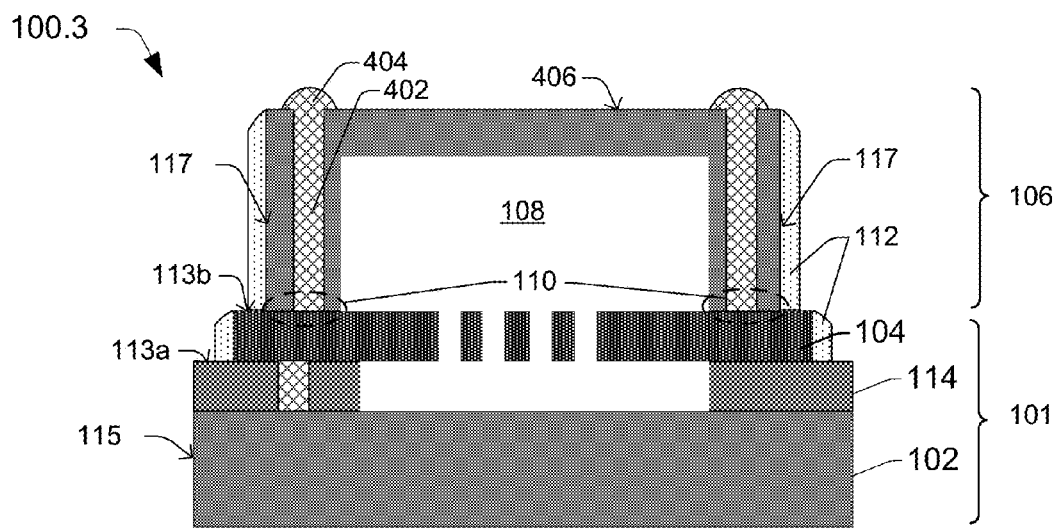

FIGS. 3 and 4 illustrate cross-sectional views of some other embodiments of MEMS devices 100.2 and 100.3, respectively, with hermetic sealing structures 112. In some embodiments, as shown in FIG. 3, the MEMS device 100.2 comprises a through silicon via (TSV) 302 passing through the first die 101. A solder bump 304 can be disposed on a back side 307 of the first die 101 to provide electrical connections through the TSV 302. In some other embodiments, as shown in FIG. 4, the MEMS device 100.3 comprises a through silicon via (TSV) 402 passing through the second die 106. A solder bump 404 can be disposed on a back side surface 406 of the second die 106 to provide electrical connections through the TSV 402. The hermetic sealing structure 112 is disposed on a longitudinal sidewall 117 of the second die 106 and not disposed on a lateral top surface 113 of the first die 101 and a singulation sidewall 115. In some embodiments, the hermetic sealing structure 112 is formed by a chemical mechanical polishing (CVD) process followed by a blanket Reactive Ion Etching (RIE) process.

Figure 5:
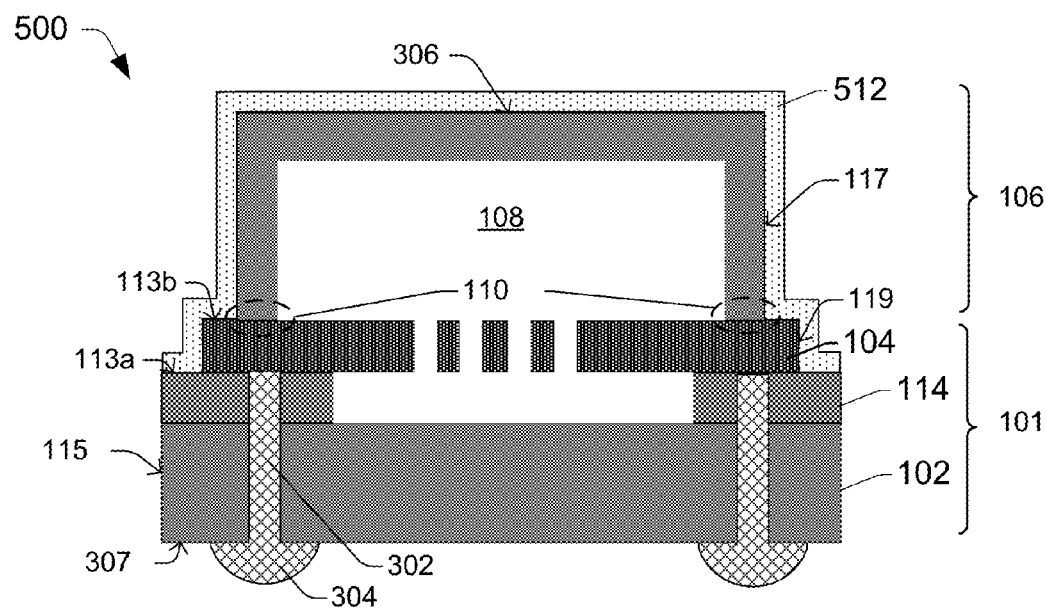
Figure 6:
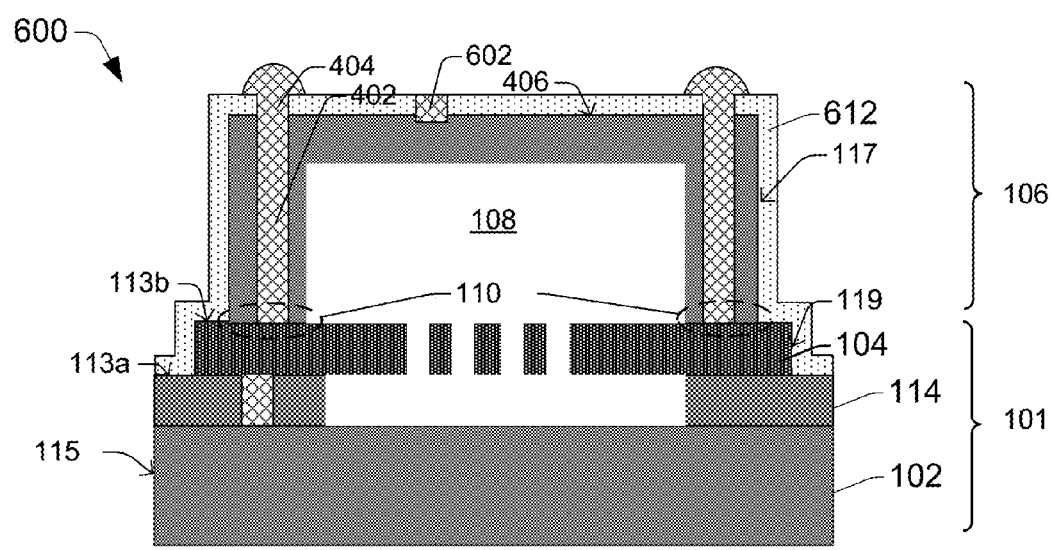

Further, in some other embodiments shown in FIGS. 5 and 6, the first die 101 and the second die 106 are bonded at a bonding interface region 110. In FIG. 5, the TSV 302 and the solder bump 304 are disposed through the first die 101 and provide electrical contact at the back side 307 of the first die 101. In FIG. 5, to seal the chamber 108 hermetically, a conformal thin film layer 512 is disposed continuously covering an outer surface of the second die 106 and an exposed surface of the first die 101 including lateral surfaces such as 306 and 113 and longitudinal surfaces such as 117 and 119. In FIG. 6, the TSV 402 and the solder bump 404 are disposed through the second die 106 and provide electrical contact at the back side surface 406 of the second die 106. In FIG. 6, to seal the chamber 108 hermetically, a conformal thin film layer 612 is disposed continuously covering an outer surface of the second die 106 and an exposed surface of the first die 101 including lateral surfaces such as 406 and 113 and longitudinal surfaces such as 117 and 119. Notably, the word "continuously" here indicates that the conformal thin film layer 512 in FIG. 5 or 612 in FIG. 6 is unbroken on both lateral and longitudinal surfaces. However, even though the conformal thin film layer 512 is continuous, the hermetical sealing structure may be interrupted on any covering surfaces due to one or more structures. For example, in FIG. 6, the conformal thin film layer 612 may be interrupted by interconnection wires such as 602 or by devices disposed there through after forming the conformal thin film layer 612. Nonetheless, even with these interruptions, the thin film layer is still "continuously" disposed from the sidewall 117 to the back side surfaces 406 of the second die 106 and the lateral top surfaces 113 of the first die 101 ending at the singulation sidewall 115.

Figure 7:
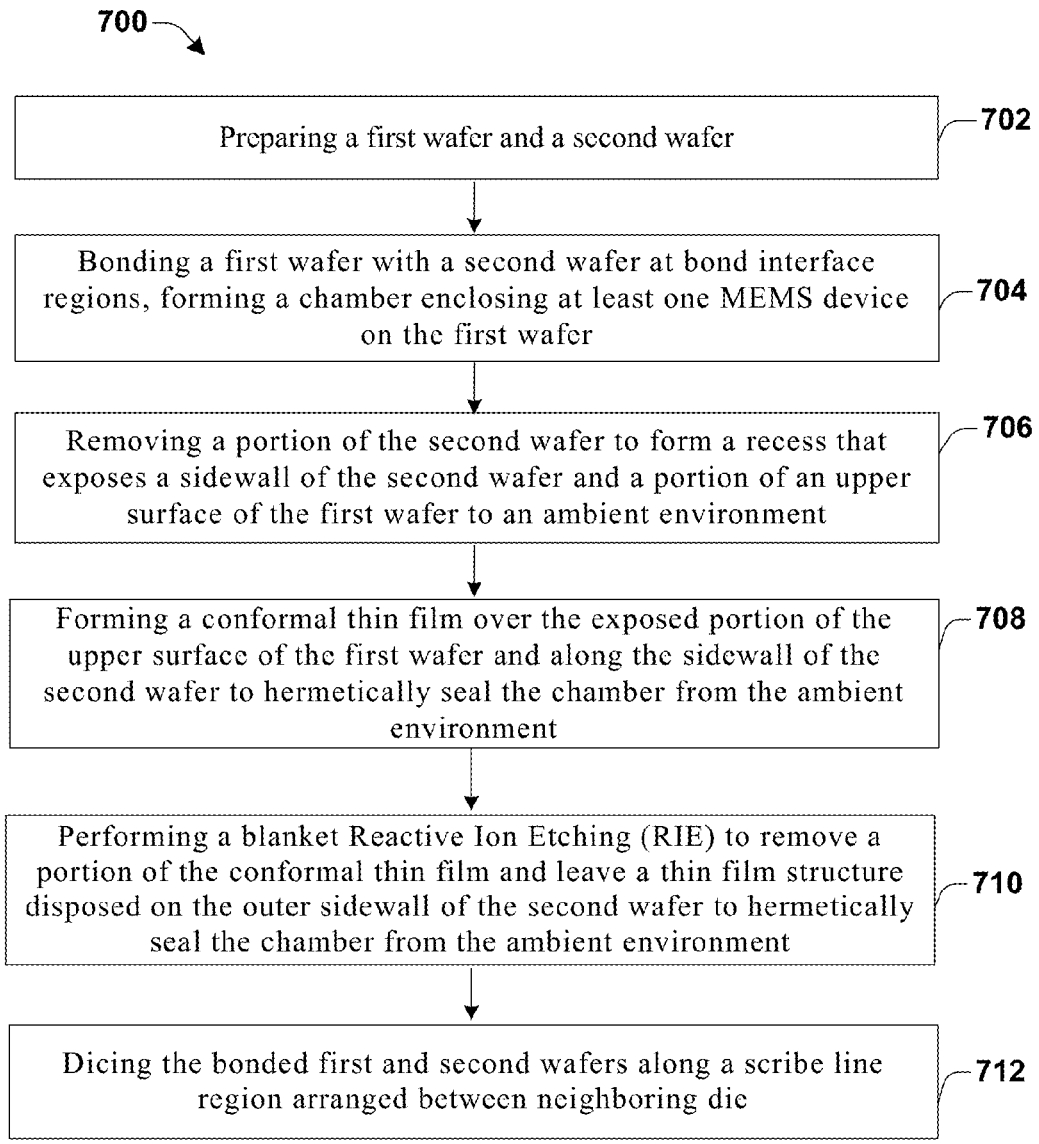
FIG. 7 illustrates a flow diagram of some embodiments of a method of forming a hermetic sealing.

FIG. 7 shows a flow diagram of some embodiments of a method 700 of forming a hermetic seal. While disclosed methods (e.g., methods 700) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 702, a first wafer and a second wafer are prepared. The first wafer can have a plurality of MEMS devices disposed thereon. The second wafer can be a capping wafer or a semiconductor wafer with devices and/or interconnection structures disposed.

At 704, the first wafer is bonded with the second wafer at bond interface regions. A chamber is formed between the bonded wafers and encloses at least one MEMS device on the first wafer.

At 706, a portion of the second wafer is removed to form a recess that exposes a sidewall of the second wafer and a portion of an upper surface of the first wafer to an ambient environment.

At 708, a conformal thin film is formed over the exposed portion of the upper surface of the first wafer and along the outer surface of the second wafer. The conformal thin film includes a sidewall and a top surface to hermetically seal the chamber from the ambient environment.

At 710, a blanket Reactive Ion Etching (RIE) process is carried out to remove a portion of the conformal thin film to expose the wire-bond pad. A remaining portion of the conformal thin film structure is disposed on the sidewall of the second wafer to hermetically seal the chamber from the ambient environment. The removed portion of the conformal thin film comprises the conformal thin film along the lateral direction including the top surface of the second wafer and the exposed portion of the first wafer.

At 712, the bonded first and second wafers are diced along a scribe line region arranged between neighboring dies.

FIGS. 8a-8f show some embodiments of cross-sectional views of protection barrier structure showing a method of forming protection barrier for an integrated microsystem.

Although FIGS. 8a-8f are described in relation to method 700, it will be appreciated that the structures disclosed in FIGS. 8a-8f are not limited to such a method.

Figure 8A:
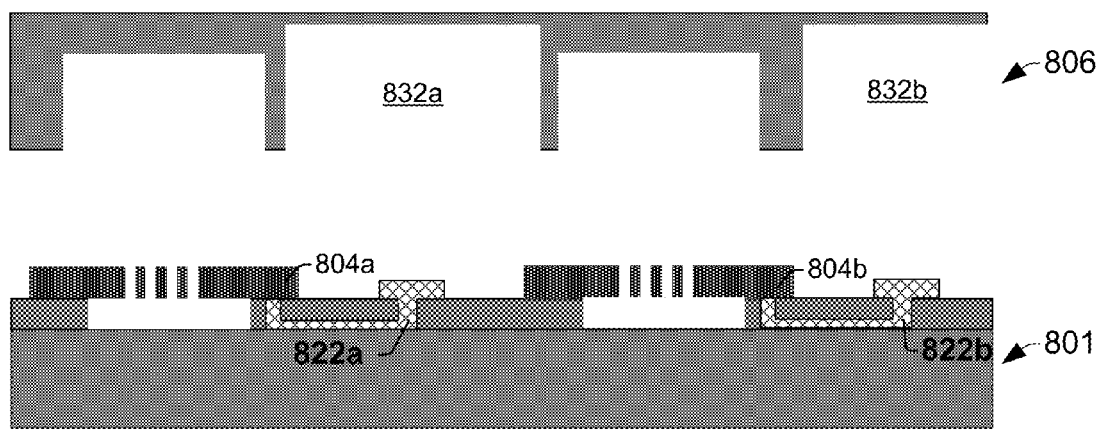
FIGS. 8a-8f illustrate some embodiments of cross-sectional views of a method of forming a hermetic sealing.

As shown in FIG. 8a, a first wafer 801 and a second wafer 806 are prepared. The first wafer 801 can have a plurality of MEMS devices 804 disposed thereon. A plurality of wire-bond pads 822 can also be disposed on the first wafer 801. The second wafer 806 can be a capping wafer or a semiconductor wafer with devices and/or interconnection structures disposed. In some embodiments, a plurality of trenches 832 can be formed in the second wafer 806 to prepare for following processes.

Figure 8B:
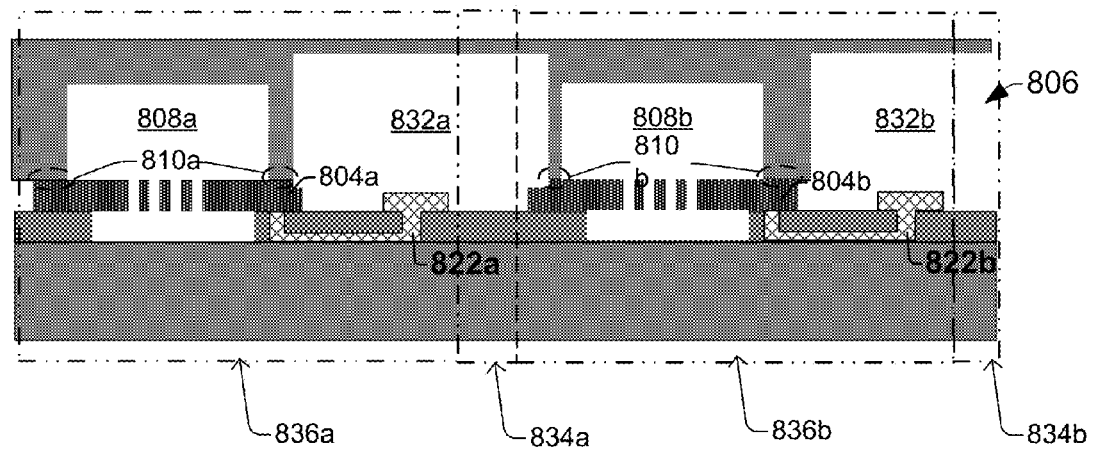

As shown in FIG. 8b, the first wafer 801 is bonded with the second wafer 806 at bond interface regions 810. A chamber 808 is formed through the bonding enclosing at least one MEMS device 804. The bonded first and second wafers 801 and 806 comprise a plurality of dies such as 836a and 836b and a plurality of scribe line regions such as 834a and 834b. For purposes of simplicity, the following takes the die 836a as an example and other die of the wafers may have a similar structure. The first wafer 801 and the second wafer 806 are bonded together at a bond interface region 810a for die 836a forming a chamber 808a.

Figure 8C:
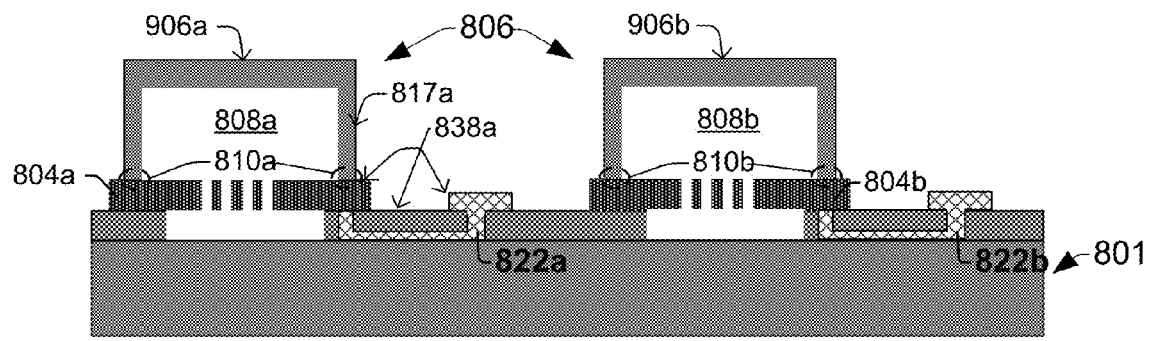

As shown in FIG. 8c, a portion of the second wafer 806 is removed to form a recess that exposes a sidewall 817a of the second wafer 806 and a portion 838a of an upper surface of the first wafer 801 to an ambient environment. In some embodiments, the portion of the second wafer 806 can be removed by patterning and etching. In some other embodiments, a grinding or a chemical mechanical polishing process can be performed to thin down a back side of the second wafer 806 to a back side surface 906 and open the trench 832a shown in FIG. 8b to for the recess.

Figure 8D:
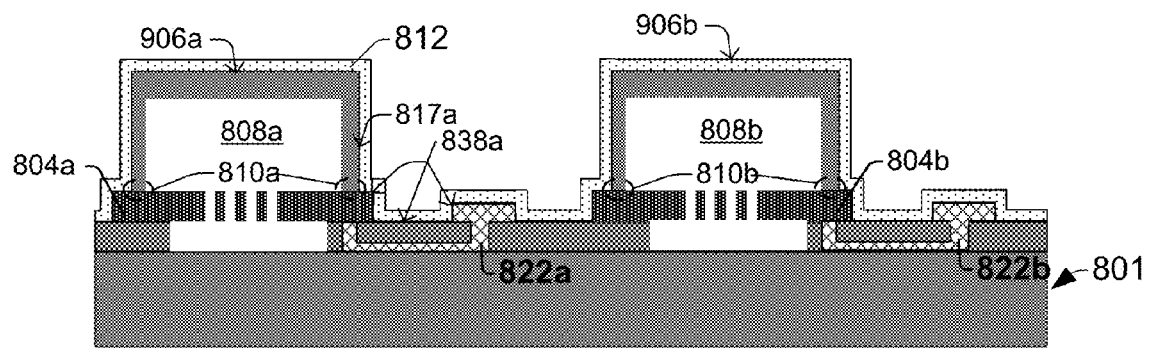

As shown in FIG. 8d, a conformal thin film 812 is formed over the exposed portion 838a of the upper surface of the first wafer 801 and along the outer surface of the second wafer including the back side surface 906a and the sidewall 817a to hermetically seal the chamber 808a from the ambient environment. In some embodiments, the conformal thin film 812 can be a single layer or multiple stacked layers of silicon nitride (Si$_3$N$_4$) or silicon dioxide (SiO$_2$) having a thickness in a range of from about 500 Å to about 10 μm. In some embodiments, the conformal thin film 812 can be formed by plasma enhanced chemical vapor deposition (PECVD).

Figure 8E:
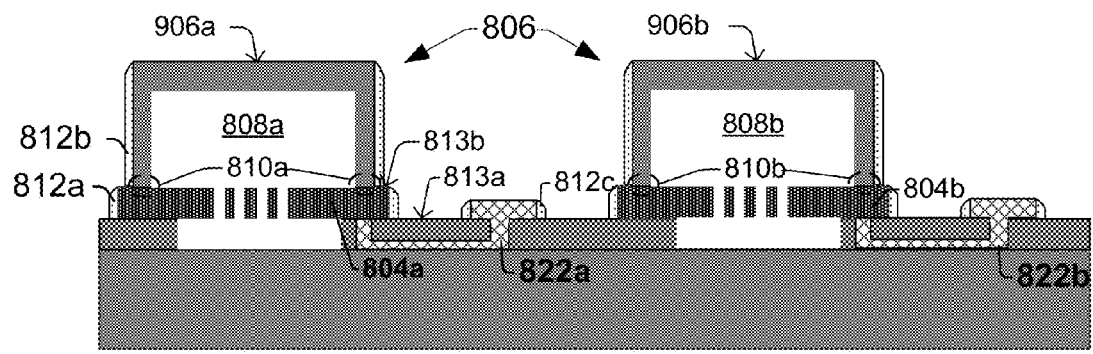

As shown in FIG. 8e, a portion of the conformal thin film 812 above the wire-bond pad 822a is removed to expose the wire-bond pad 822a. In some embodiments, a blanket Reactive Ion Etching (RIE) can be performed to remove the portion of the conformal thin film 812 together with some other portions of the conformal thin film 812 disposed laterally, for example, portions of the conformal thin film 812 disposed on surfaces 813a and 813b and 906a. A remaining conformal thin film structure 812 comprises portions disposed on the longitudinal sidewalls of the second wafer 806 (812b), the MEMS device 804a (812a) and the wire-bond pad 822a (812c). The remaining conformal thin film structure 812 hermetically seals the chamber 808a from the ambient environment.

Figure 8F:
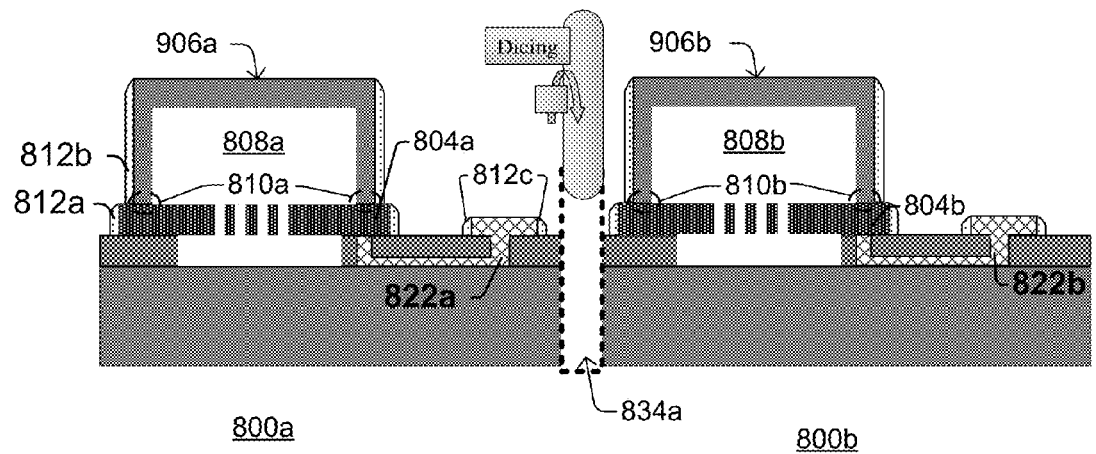

As shown in FIG. 8f, the bonded wafer is diced along a scribe line region 834a arranged between neighboring dies. Individual dies such as 800a and 800b are released after the dicing.

In some embodiments, the present disclosure relates to a MEMS device with a hermetic sealing structure. The MEMS device comprises a first die, a second die bonded together. The first die has a MEMS device disposed thereon. The first die and the second die are bonded at a bond interface region to form a chamber there between. The MEMS device resides at least partially within the chamber or is in fluid communication with the chamber. The MEMS device further comprise a conformal thin film structure disposed along an outer sidewall of the second die.

In other embodiments, the present disclosure relates to a hermetical sealing structure. The hermetical sealing structure comprises a first die, a second die and a conformal thin film structure. The first die and the second die are bonded at a bond interface region to form a chamber between the first die and the second die. The conformal thin film structure is disposed at an outer sidewall of the bond interface region to hermetically seal the chamber form the ambient environment. The conformal thin film structure does not cover a lateral surface of the first or second die.

In yet other embodiments, the present disclosure relates to a method of forming a hermetic sealing. In this method, a first wafer is bonded with a second wafer at bond interface regions. The first wafer has a plurality of MEMS devices disposed thereon and the first and second wafers are bonded together to form a chamber enclosing at least one MEMS device on the first wafer. Then a portion of the second wafer is removed to form a recess that exposes a sidewall of the second wafer and a portion of an upper surface of the first wafer to an ambient environment. Then a conformal thin film layer is formed over the exposed portion of the upper surface of the first wafer and along the sidewall of the second wafer to hermetically seal the chamber from the ambient environment. Then the bonded first and second wafers are diced along a scribe line region arranged between neighboring die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a first die having a MEMS device disposed thereon;
a second die bonded to the first die at a bond interface region to form a chamber between the first die and the second die, wherein the MEMS device resides at least partially within the chamber or is in fluid communication with the chamber;
a conformal thin film structure disposed along an outer sidewall of the second die; and
a through silicon via (TSA) arranged through the first die or the second die and a solder bump disposed on a back side surface of the first die or the second die.

2. The integrated circuit of claim 1, wherein the chamber is hermetically sealed by the conformal thin film structure.

3. The integrated circuit of claim 1, wherein the conformal thin film structure comprises a single layer or multiple stacked layers of silicon nitride (Si$_3$N$_4$) or silicon dioxide (SiO$_2$).

4. The integrated circuit of claim 1, wherein the conformal thin film structure has a thickness in a range of from about 500 Å to about 10 μm.

5. The integrated circuit of claim 1, wherein the conformal thin film structure terminates on a lateral surface of the first die and wherein the conformal thin film structure does not extend along singulated sidewalls of the first die.

6. The integrated circuit of claim 1, wherein the conformal thin film structure is a continuous thin layer covering an outer surface of the second die.

7. The integrated circuit of claim 1, wherein the conformal thin film structure comprises several discrete thin film patches comprising a first thin film patch disposed on the outer sidewall of the bond interface region, a second thin film patch disposed on a sidewall of the MEMS device and a third thin film patch disposed on a sidewall of a wire-bond pad.

8. The integrated circuit of claim 7, wherein the conformal thin film structure is formed by a blanket Reactive Ion Etching (RIE) process.

9. The integrated circuit of claim 1, wherein the first die and the second die are bonded by a eutectic metal bond.

10. The integrated circuit of claim 1, wherein the bond interface region comprises materials selected from a group consisting of indium, gold, tin, copper, aluminum, germanium and combinations thereof.

11. The integrated circuit of claim 1, wherein the chamber is filled with an inert gas having a substantially constant pressure.

12. The integrated circuit of claim 1, wherein the second die includes CMOS devices arranged thereon.

13. An integrated circuit, comprising:
a first die comprising a MEMS device disposed on a substrate;
a second die bonded to the first die at a bond interface region to form a chamber between the first die and the second die, wherein the MEMS device resides at least partially within the chamber or is in fluid communication with the chamber; and
a conformal dielectric film disposed along an outer sidewall of the second die, extending to cover an outer sidewall of the bond interface region to hermetically seal the chamber from an ambient environment;

wherein the conformal dielectric film is absent from a back surface of the second die at an opposite side from the first die.

14. The integrated circuit of claim 13, wherein the conformal dielectric film terminates on a lateral surface of the first die and does not extend along the lateral surface.

15. The integrated circuit of claim 13, wherein the conformal dielectric film covers an upper sidewall of the first die recessed back from a lower sidewall of the first die.

16. The integrated circuit of claim 15, wherein the conformal dielectric film is absent from the lower sidewall of the first die.

17. The integrated circuit of claim 13, wherein the conformal dielectric film comprises a single layer or multiple stacked layers of silicon nitride ($Si_3N_4$) or silicon dioxide ($SiO_2$).

18. An integrated circuit, comprising:
a first die comprising a MEMS device disposed on a substrate;
a second die bonded to an upper surface of the MEMS device, enclosing a chamber between the MEMS device and the second die, wherein the upper surface of the MEMS device has an inner portion residing within the chamber and an outer portion residing outside the chamber; and
a conformal dielectric film disposed along an outer sidewall of the second die, the conformal dielectric film extending to the outer portion of the upper surface of the MEMS device to hermetically seal the chamber from an ambient environment.

19. The integrated circuit of claim 1, wherein the conformal thin film is disposed between the solder bump and the back side surface of the first die or the second die.

20. An integrated circuit, comprising:
a first die having a MEMS device disposed thereon;
a second die bonded to the first die at a bond interface region to form a chamber between the first die and the second die, wherein the MEMS device resides at least partially within the chamber or is in fluid communication with the chamber; and
a conformal thin film structure disposed along an outer sidewall of the second die, and comprising several discrete thin film patches including g a first thin film patch disposed on the outer sidewall of the bond interface region and a second thin film patch disposed on a sidewall of a wire-bond pad.

21. The integrated circuit of claim 20, wherein the conformal thin film further includes a third thin film patch disposed on a sidewall of the MEMS device.

* * * * *